(12) United States Patent
Kleint et al.

(10) Patent No.: US 8,009,477 B2
(45) Date of Patent: Aug. 30, 2011

(54) INTEGRATED CIRCUIT AND METHOD OF FORMING AN INTEGRATED CIRCUIT

(75) Inventors: Christoph Kleint, Dresden (DE); Nicolas Nagel, Dresden (DE); Dominik Olligs, Dresden OT Langebrueck (DE); Matthias Markert, Dresden (DE)

(73) Assignee: Qimonda AG, Munich (DE)

( * ) Notice: Subject to any disclaimer, the term of this patent is extended or adjusted under 35 U.S.C. 154(b) by 472 days.

(21) Appl. No.: 12/182,714

(22) Filed: Jul. 30, 2008

(65) Prior Publication Data

US 2010/0027311 A1   Feb. 4, 2010

(51) Int. Cl.
*G11C 11/40* (2006.01)
*H01L 27/088* (2006.01)
*H01L 29/78* (2006.01)
*H01L 21/4763* (2006.01)

(52) U.S. Cl. .......... 365/185.17; 257/314; 257/401; 257/E21.585; 257/E29.128; 438/618

(58) Field of Classification Search .......... 438/618; 257/314, 401, E21.585, E29.128; 365/185.17
See application file for complete search history.

(56) References Cited

U.S. PATENT DOCUMENTS

| | | | |
|---|---|---|---|
| 5,552,343 A | 9/1996 | Hsu | |
| 5,776,825 A * | 7/1998 | Suganaga et al. | 438/618 |
| 5,915,198 A | 6/1999 | Ko et al. | |
| 6,211,557 B1 | 4/2001 | Ko et al. | |
| 6,847,555 B2 * | 1/2005 | Toda | 365/185.21 |
| 7,745,325 B2 * | 6/2010 | Koh et al. | 438/622 |

* cited by examiner

*Primary Examiner* — Evan Pert
(74) *Attorney, Agent, or Firm* — Dicke, Billig & Czaja, PLLC

(57) ABSTRACT

An integrated circuit and a method of forming an integrated circuit. One embodiment includes a conductive line formed above a surface of a carrier. A slope of the sidewalls of the conductive line in a direction perpendicular to the surface of the carrier reveals a discontinuity and a width of the conductive line in an upper portion thereof is larger than the corresponding width in the lower portion.

30 Claims, 13 Drawing Sheets

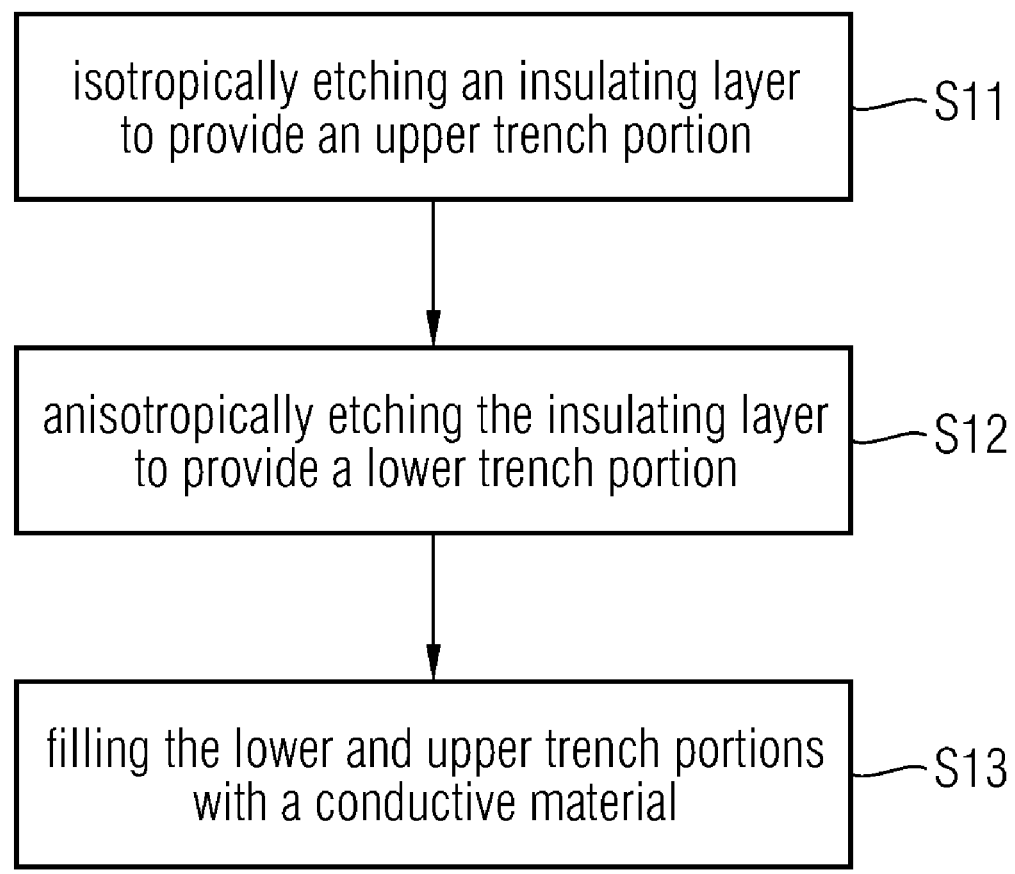

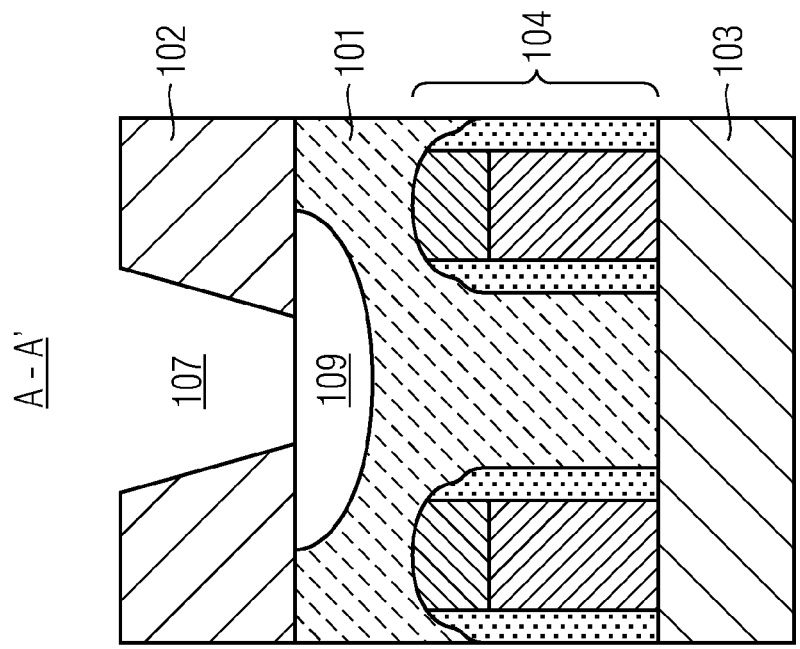
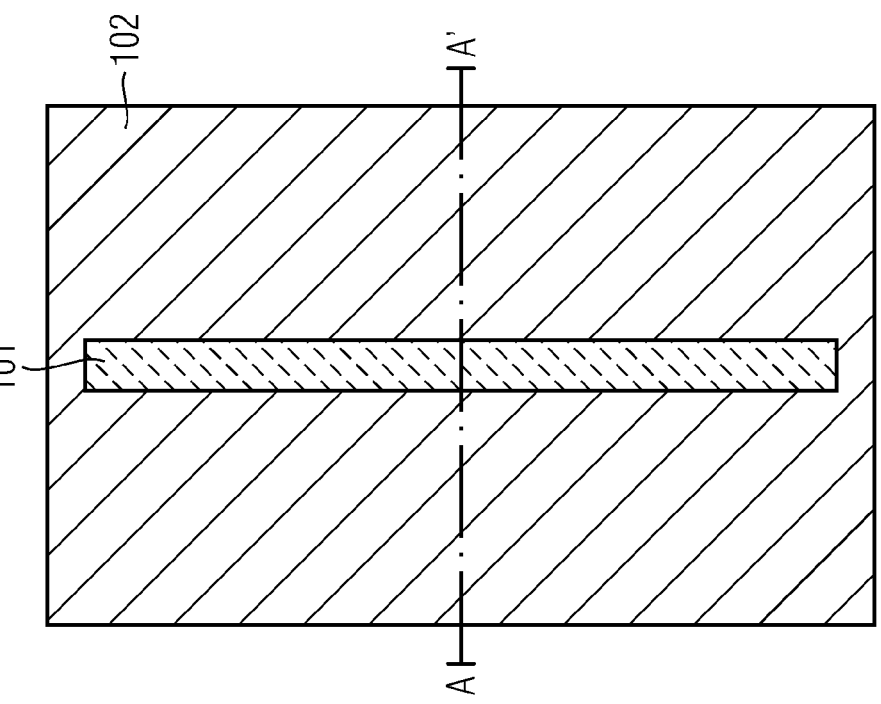

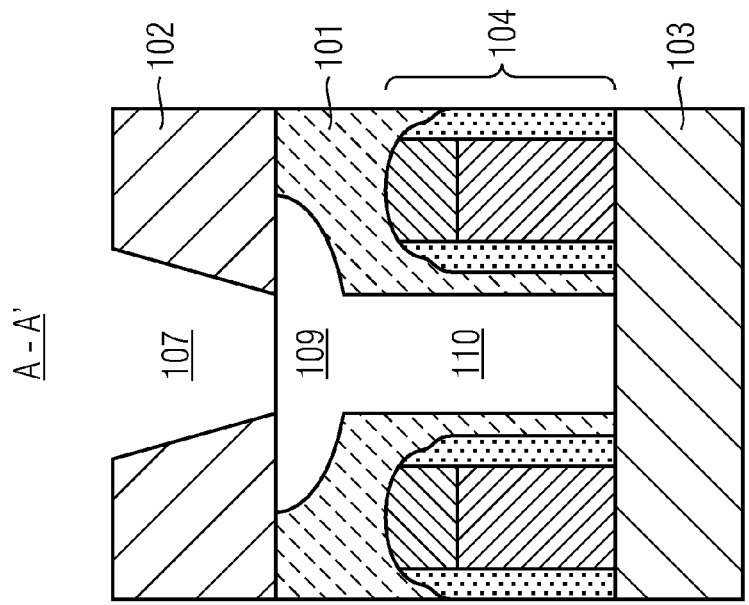
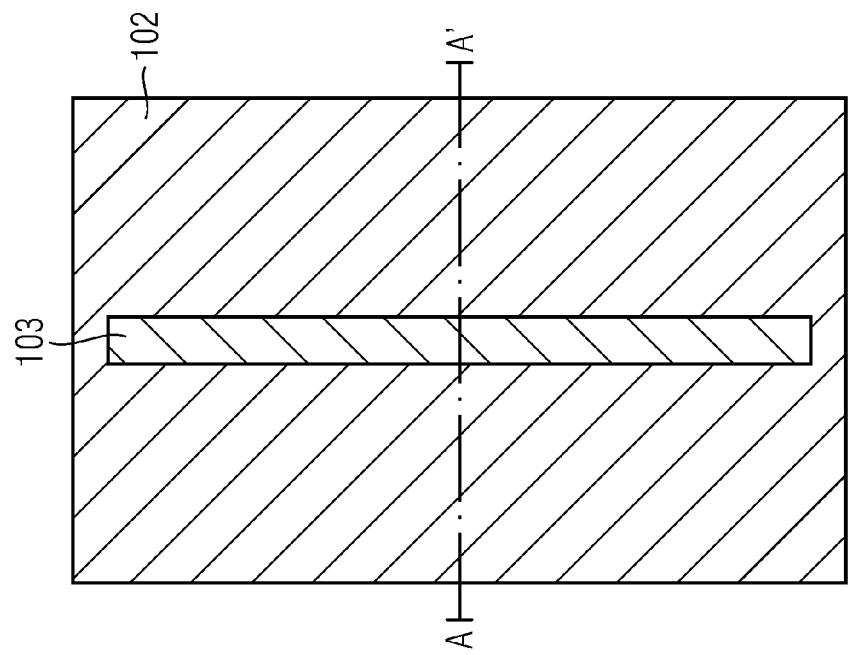

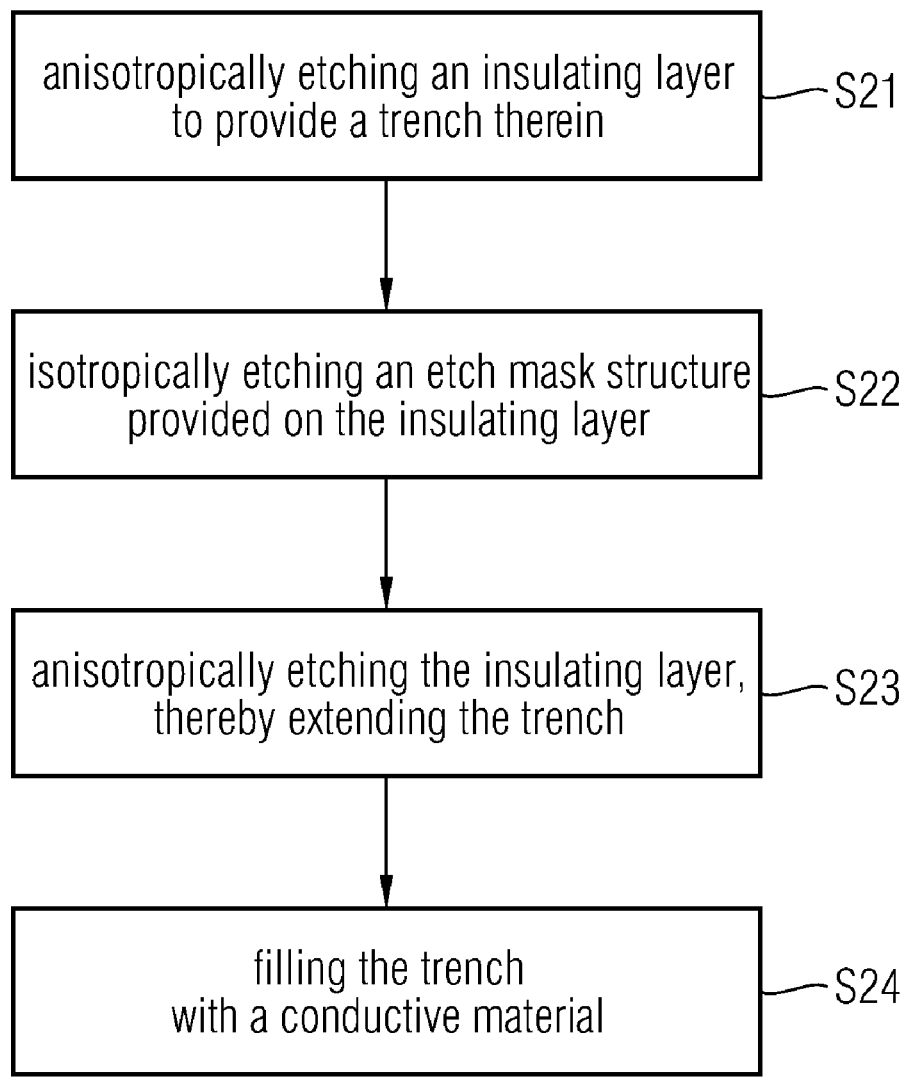

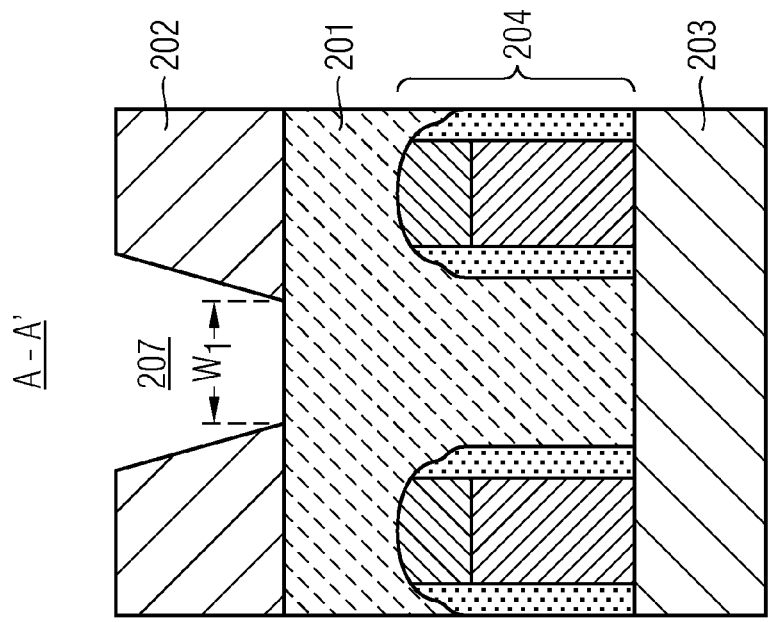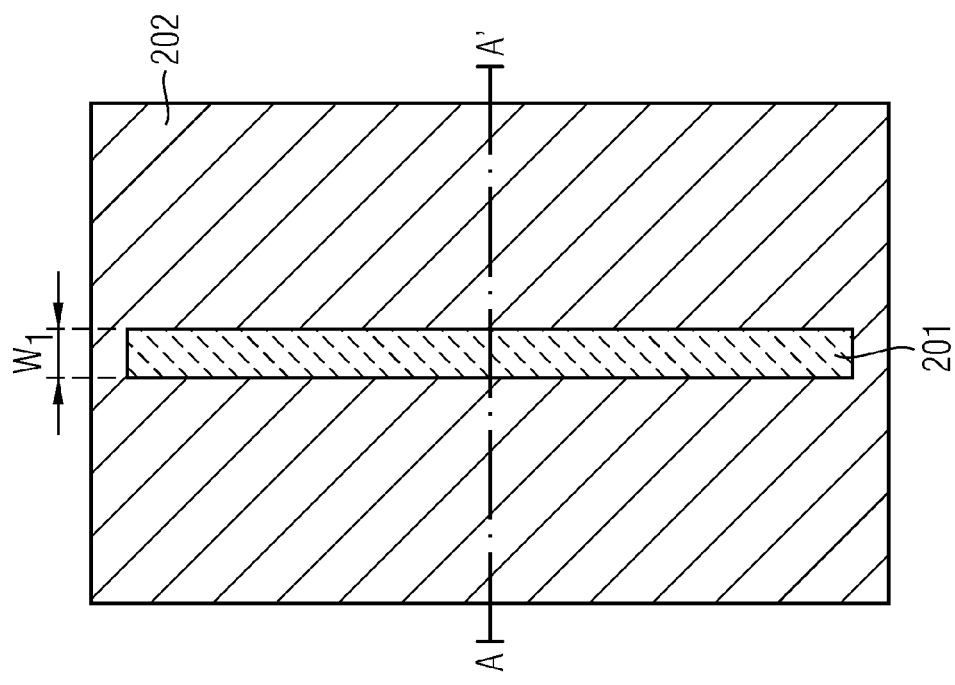

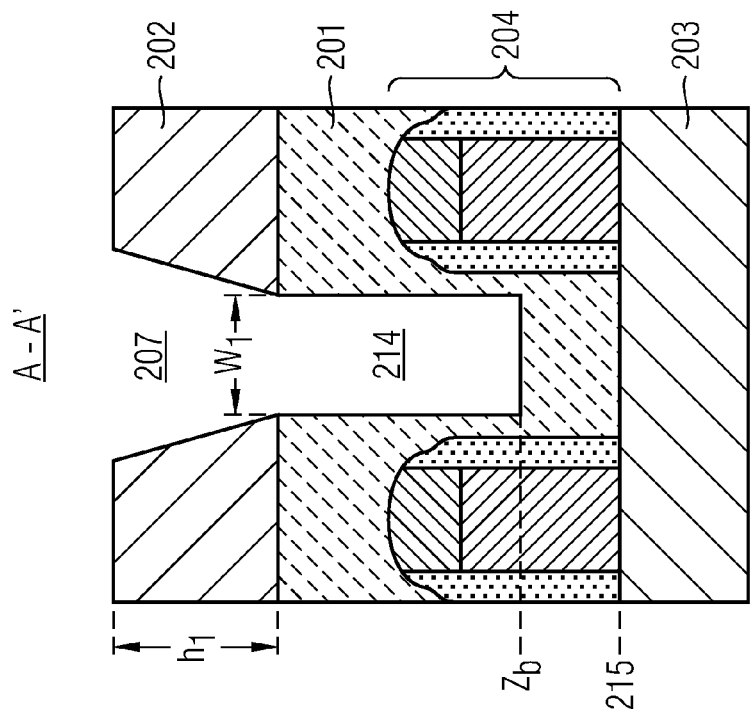
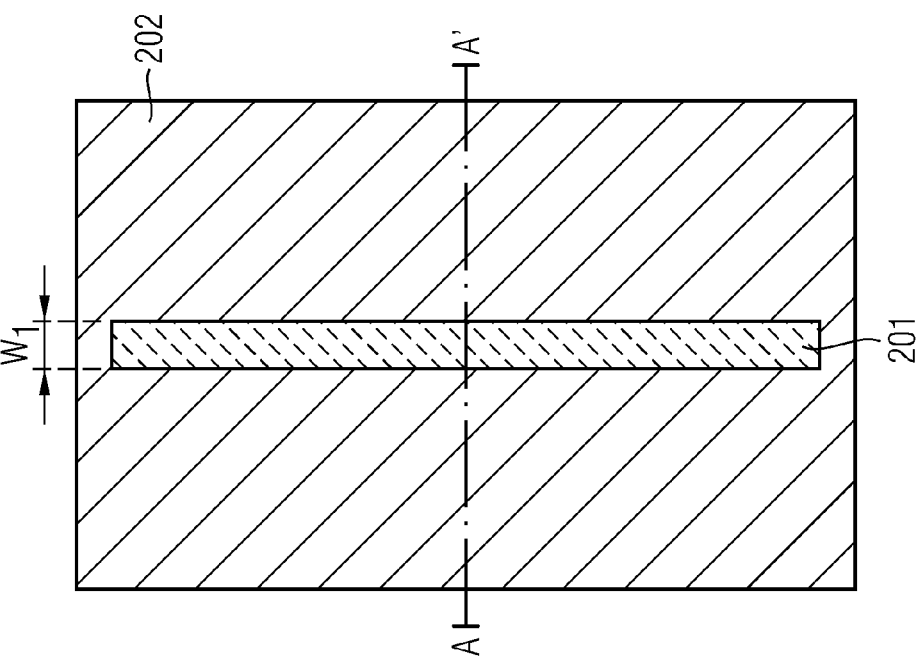

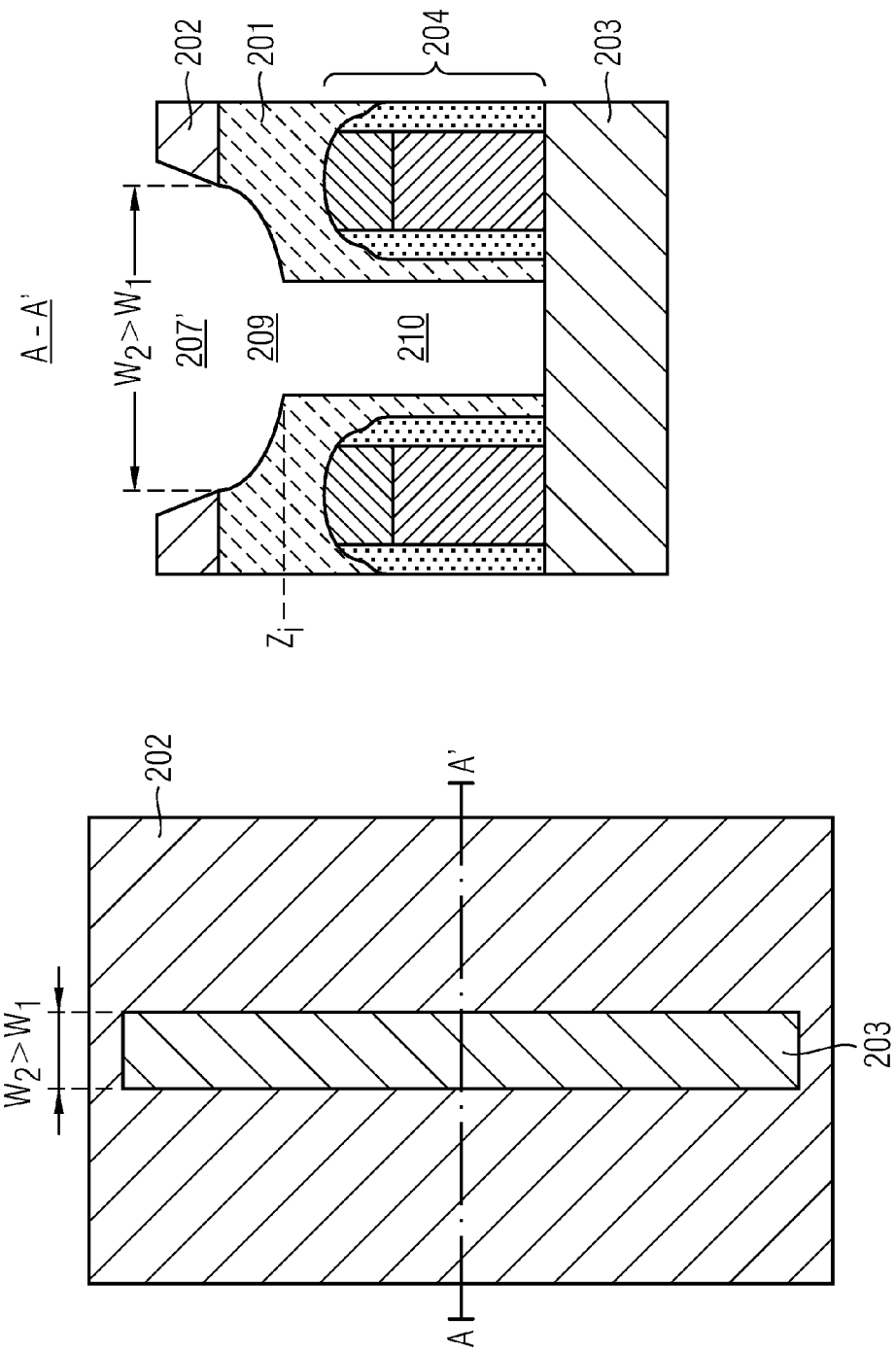

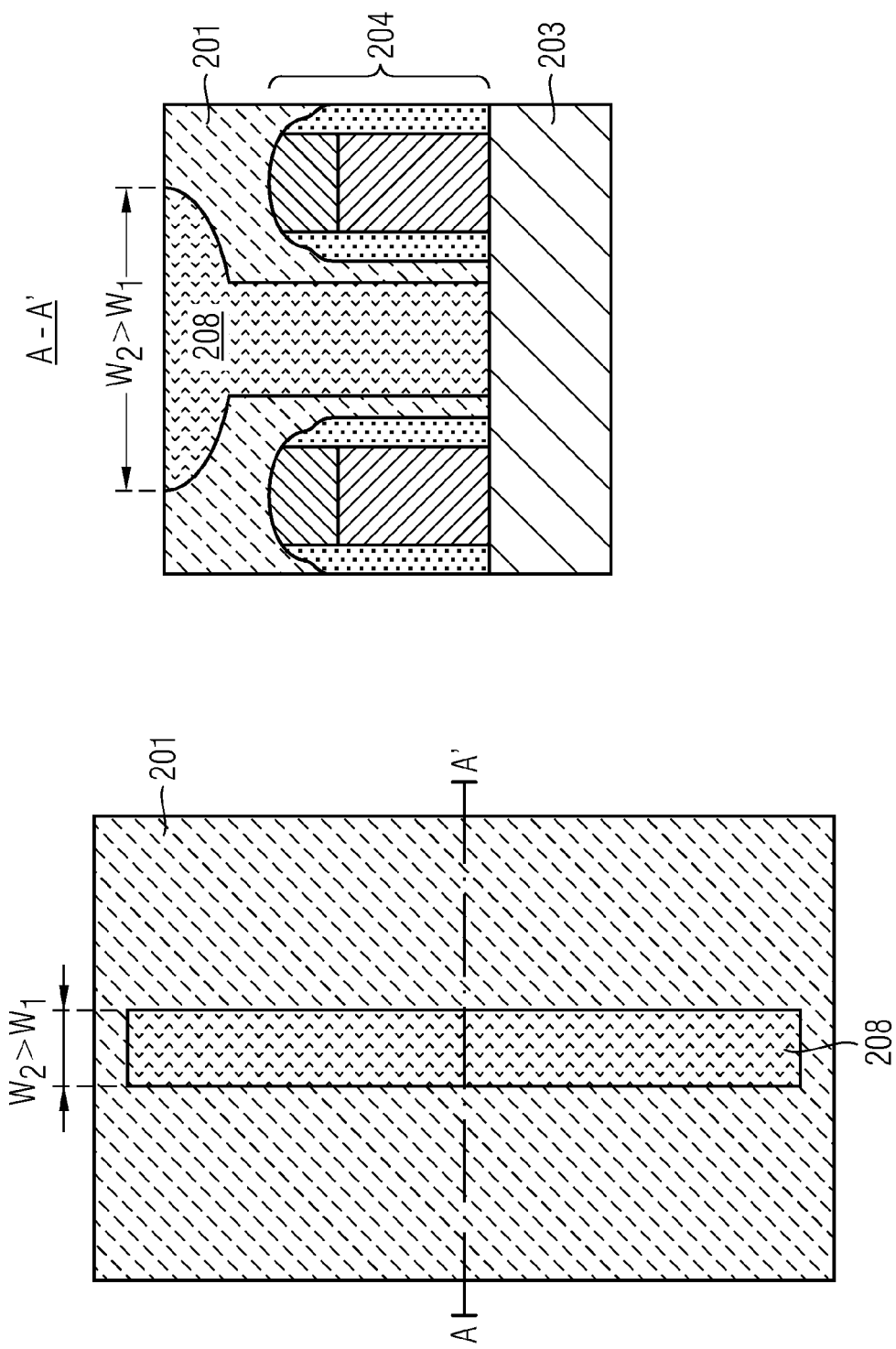

INTEGRATED CIRCUIT AND METHOD OF FORMING AN INTEGRATED CIRCUIT

BACKGROUND

The present specification relates to a memory device, an integrated circuit as well as to an electronic device. The specification further refers to a method of forming an integrated circuit.

A shrink of minimum feature sizes of integrated circuits allows to decrease the costs per integrated circuit by a corresponding increase of the package density per wafer. The miniaturization of integrated circuits may also affect conductive lines.

By way of example, also the width of a source line between selected transistors may be decreased when scaling a NAND memory cell array to smaller minimum feature sizes.

Scaling of conductive lines introduces challenges in view of, for example, conductivity requirements or critical dimensions that have to be handled in order to meet designated reliability demands.

Generally, an integrated circuit, which has a high reliability in its operation characteristic is desired.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a flow chart illustrating a method according to one embodiment.

FIGS. 2A to 5 illustrate top views and cross-sectional views of a carrier when performing a method according to one embodiment.

FIG. 8 illustrates a flowchart illustrating a method according to one embodiment.

FIG. 9A to 13B illustrate top views and cross-sectional views of a carrier when performing a method according to one embodiment.

DETAILED DESCRIPTION

Figure 2B:
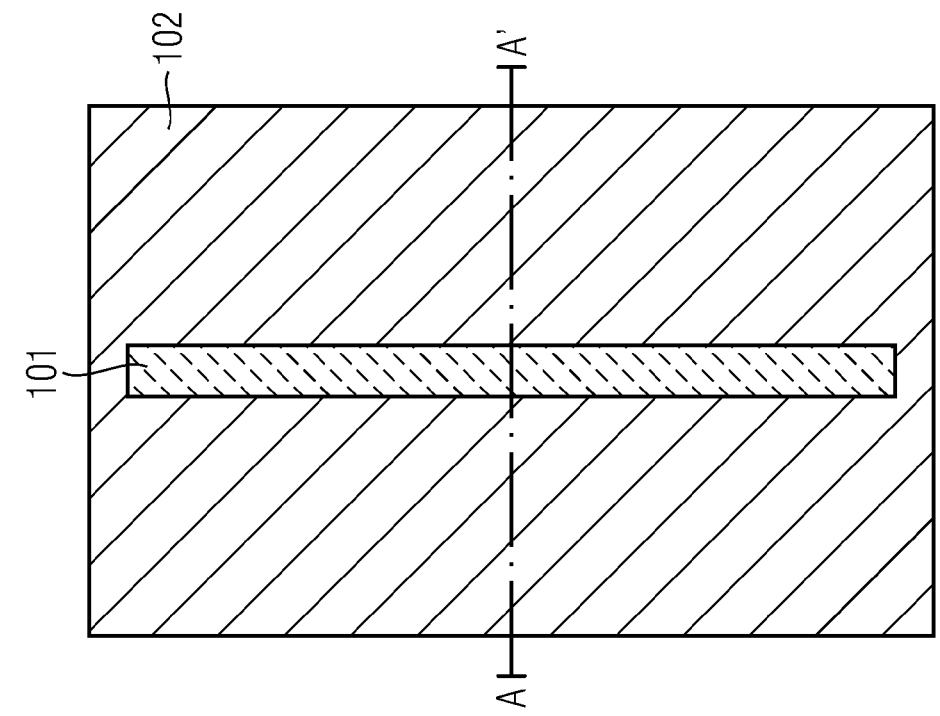

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIG. 1 schematically illustrates a flowchart illustrating one embodiment of a method. First, an insulating layer is isotropically etched to provide an upper trench portion (S11). Isotropic etching refers to an etch process having corresponding etch rates in different directions in the material to be etched, whereas, in contrast thereto, anisotropic etching means different etch rates in different directions in the material to be etched. In one embodiment, isotropic etching may be performed by wet etching using liquid acids/bases or by dry etching such as Chemical Downstream Etching (CDE).

In one embodiment, dry etching such as reactive ion etching (RIE), sputter etching or vapor phase etching may be used to achieve an anisotropic etching by properly adjusting the balance of the chemical and physical etch parts. The insulating layer may be formed as an oxide or/and nitride layer over a surface of a carrier. The carrier may be a pre-processed or blank semiconductor, such as an Si, GaAs or SOI (silicon-on-insulator) substrate, for example. After provision of the upper trench portion, the insulating layer is anisotropically etched to provide a lower trench portion (S12). Thereby, a plurality of active areas at the surface of the carrier are uncovered. The etch processes may be applied on designated parts of the insulating layer by using an appropriate etch mask on top of the insulating layer. In one embodiment, the etch mask may be formed as a patterned resist mask or as a patterned hard mask such as a patterned oxide layer or nitride layer. As the upper trench portion is formed by isotropically etching the insulating layer, whereas the lower trench portion is anisotropically etched using a common etch mask structure, a width of the upper trench portion is larger than the corresponding width of the lower trench portion due to a lateral underetch of the etch mask opening when forming the upper trench portion. The upper trench portion and the lower trench portion together define a through-hole in the insulating layer uncovering the carrier. After formation of the upper and lower trench portions, they are filled with a conductive material (S13) to provide a conductive line including an upper line portion and a lower line portion. Above method allows to achieve a conductive line including a top critical dimension being larger compared to the bottom critical dimension.

Figure 2A:
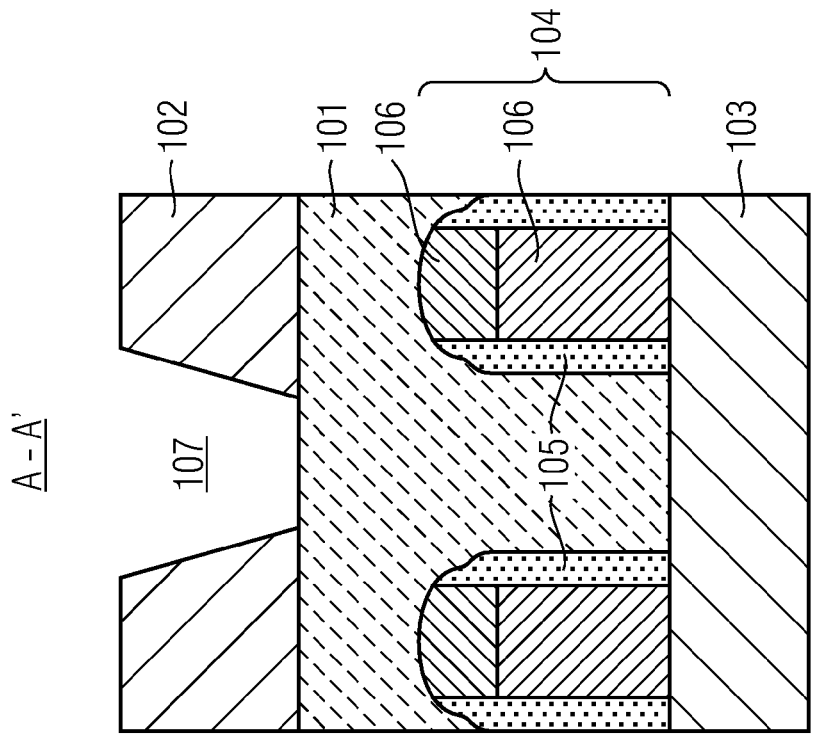

FIG. 2A illustrates a top view of a carrier including an insulating layer 101 thereon when performing a method according to one embodiment. On top of the insulating layer 101, an etch mask structure 102 is formed, the etch mask structure 102 including a line opening that uncovers a part of the insulating layer 101 to be etched in order to define the conductive line. The cut line A-A' denotes the position of the cross-sectional views presented herein below.

Referring to FIG. 2B, a schematic cross-sectional view along the cut line A-A' of FIG. 2A is illustrated. It is to be noted that the Figures described herein merely illustrate a section of a carrier to be processed, so that the method features are simultaneously applied to further parts of the carrier, which are not illustrated in the Figures presented herein. The carrier 103 is already pre-processed and includes a gate structure 104. The gate structure 104 may include a spacer structure 105 and a gate layer sequence 106 including, for example, insulating and conductive layers. As an example, the gate structure 104 may be ascribed to select transistors of a NAND string of a NAND memory cell array. The insulating layer 101 is formed over the pre-processed carrier 103. The etch mask structure 102 is formed on top of the insulating layer 101 and includes the etch mask opening 107 to uncover those parts of the insulating layer 101 which have to be etched in order to form the conductive line. In one embodiment, the opening 107 may be formed as a straight line. However, the opening may also be formed as an undulated line or as an opening including consecutive linear parts.

Referring to the schematic top view of FIG. 3A, an isotropic etch process is applied to the insulating layer 101 in order to provide an upper trench portion (not visible in FIG. 3A, see FIG. 3B).

In the schematic cross-sectional view of FIG. 3B, which is taken along the cut line A-A' of FIG. 3A, the upper trench portion 109 is formed by the isotropic etch process applied to the insulating layer 101. In one embodiment, the isotropic etch process may be carried out by dry-etching using Chemical Downstream Etching (CDE) involving a $CF_4/O_2$ chemistry at a pressure in the range of around 450 mTorr. The isotropic etching may also be carried out by wet etching leading to a lateral underetch of the etch mask structure 102. As can be gathered from FIG. 3B, the upper trench portion 109 does not penetrate through the insulating layer 101, or, differently stated, the upper trench portion 109 does not form a through-hole in the insulating layer 101.

Referring to FIG. 4A, an anisotropic etch process is applied to the insulating layer 101 to provide a lower trench portion uncovering respective parts of the carrier 103 (trench portions not visible in FIG. 4A, see FIG. 4B). As an example, the uncovered part of the carrier may include a plurality of active areas separated by STI (shallow trench isolation). The active areas may be associated with a plurality of NAND strings, for example.

FIG. 4B illustrates a cross-sectional view along the cut line A-A' of FIG. 4A. As can be gathered from FIG. 4B, the upper trench portion 109 and the lower trench portion 110 define a through-hole in the insulating layer 101. As an example, the upper trench portion 109 includes curved sidewalls, whereas the lower trench portion 110 includes vertical sidewalls. As a further example, the sidewalls of the lower trench portion 110 may be tapered. A width of the upper trench portion 109 at a top side thereof is larger than a width of the lower trench portion 110 at a bottom side thereof. Hence, an area of a top side of the upper trench portion 109 is larger than the respective area of the bottom side of the lower trench portion 110. The lower trench portion may be formed inbetween neighboring gate structures 104. As can be gathered from FIG. 4B, a critical dimension at the top of the through-hole consisting of the upper trench portion 109 and the lower trench portion 110 is larger than the critical dimension that is achieved at the bottom side of the through-hole. This effect can be ascribed to the different etch processes applied to the insulating layer 101.

Figure 5:
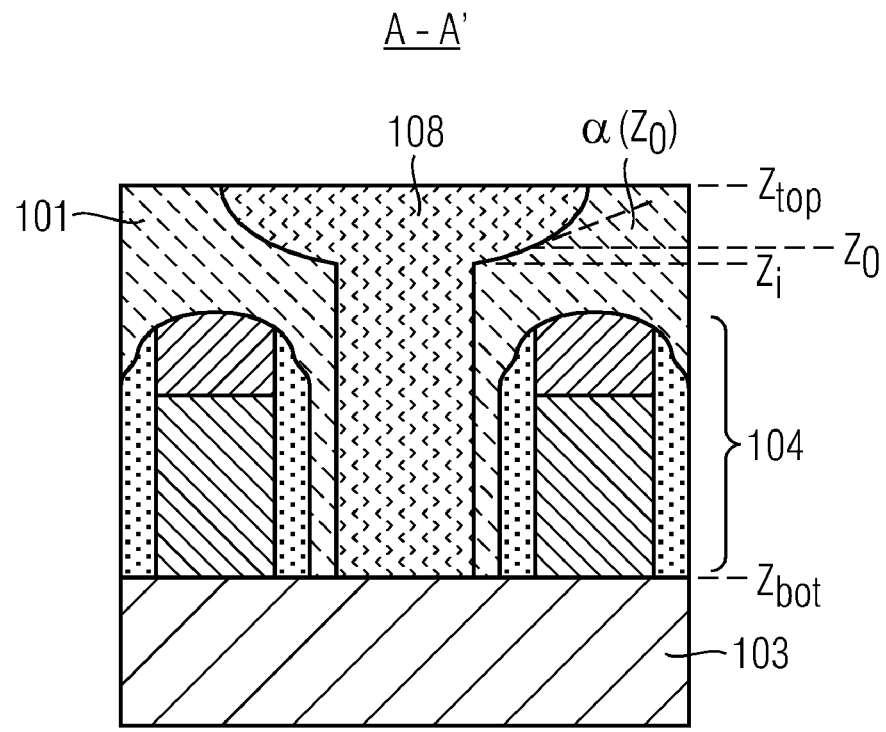

Referring to FIG. 5, a schematic cross-sectional view along the cutline A-A' of FIG. 4A is illustrated after the lower trench portion 110 and the upper trench portion 109 are filled with a conductive material to provide the conductive line 108. The material of the conductive line may be any conductive material such as metal, noble metal, metal alloys or doped semiconductor material. Exemplary materials include W, Ti, Wn, TaN, Cu, Ta, Al, metal silicide, doped silicon of any crystal structure, such as doped polysilicon or doped amorphous silicon or any combination thereof. The conductive line may further include a conductive liner made of, for example, Ti, TiN, TaN. A slope of the sidewall profile of the conductive line 108 at a position z between a lower reference level $z_{bot}$ coinciding with a surface of the carrier 103 and an upper level $z_{top}$ at the top side of the conductive line 108 is denoted by $\alpha(z)$, wherein z refers to a height level of the conductive line 108 inbetween the upper and lower limits $z_{top}$ and $z_{bot}$. The slope $\alpha(z)$ of the sidewall profile is measured relative to a surface being parallel to the surface of the carrier 103 at the position $z_{bot}$ in a direction perpendicular to this surface. As an example, a slope $\alpha(z_0)$ at the height level $z_0$ is illustrated in FIG. 5.

Figure 6:
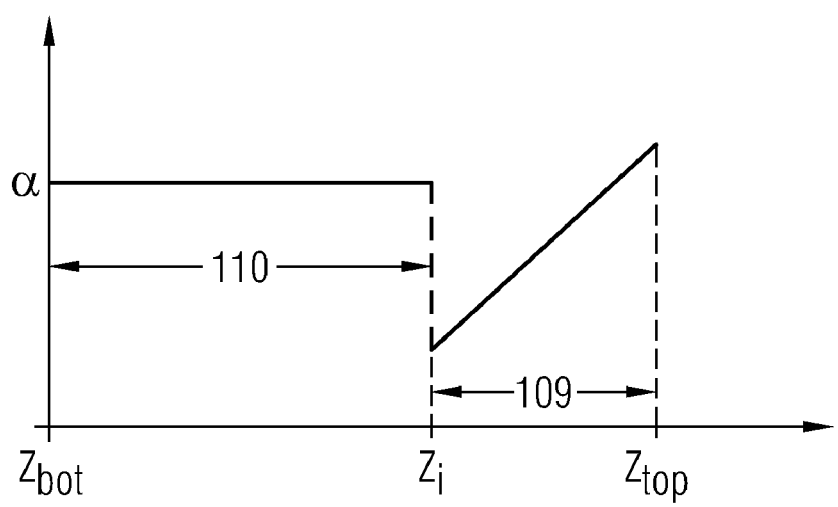
FIG. 6 illustrates a diagram illustrating a slope along a sidewall profile of a conductive line according to one embodiment.

FIG. 6 illustrates a schematic diagram to illustrate the slope of the sidewall profile of the conductive line 108 according to one embodiment. In the context of the terminology used in the cross-sectional view of FIG. 5, the slope $\alpha$ is illustrated within the height limits of $z_{bot}$ and $z_{top}$. Starting from the bottom side of the conductive line 108, the slope $\alpha$ along the lower trench portion 110 corresponding to a lower conductive line portion is constant up to a height level $z_i$ designating an interface between the lower trench portion 110 and the upper trench portion 109. At this interface level $z_i$, the slope $\alpha$ reveals a discontinuity due to a transition between the distinctly etched trench portions, namely the isotropically etched upper trench portion 109 and the anisotropically etched lower trench portion 110. Due to the underetch of the etch mask structure 102 during formation of the upper trench portion 109, the sidewall profile thereof is curved leading to a slope $\alpha$ that is, at the interface denoted by $z_i$, comparatively smaller than the corresponding slope of the lower trench portion 110. Due to the curved sidewall profile of the upper trench portion 109, the slope $\alpha$ increases from the interface level $z_i$ to the top level $z_{top}$ designating a top side of the conductive line 108. Hence, above method facilitates a sidewall profile having a discontinuity with a single lithography step, namely the patterning of the etch mask structure.

Figure 7:
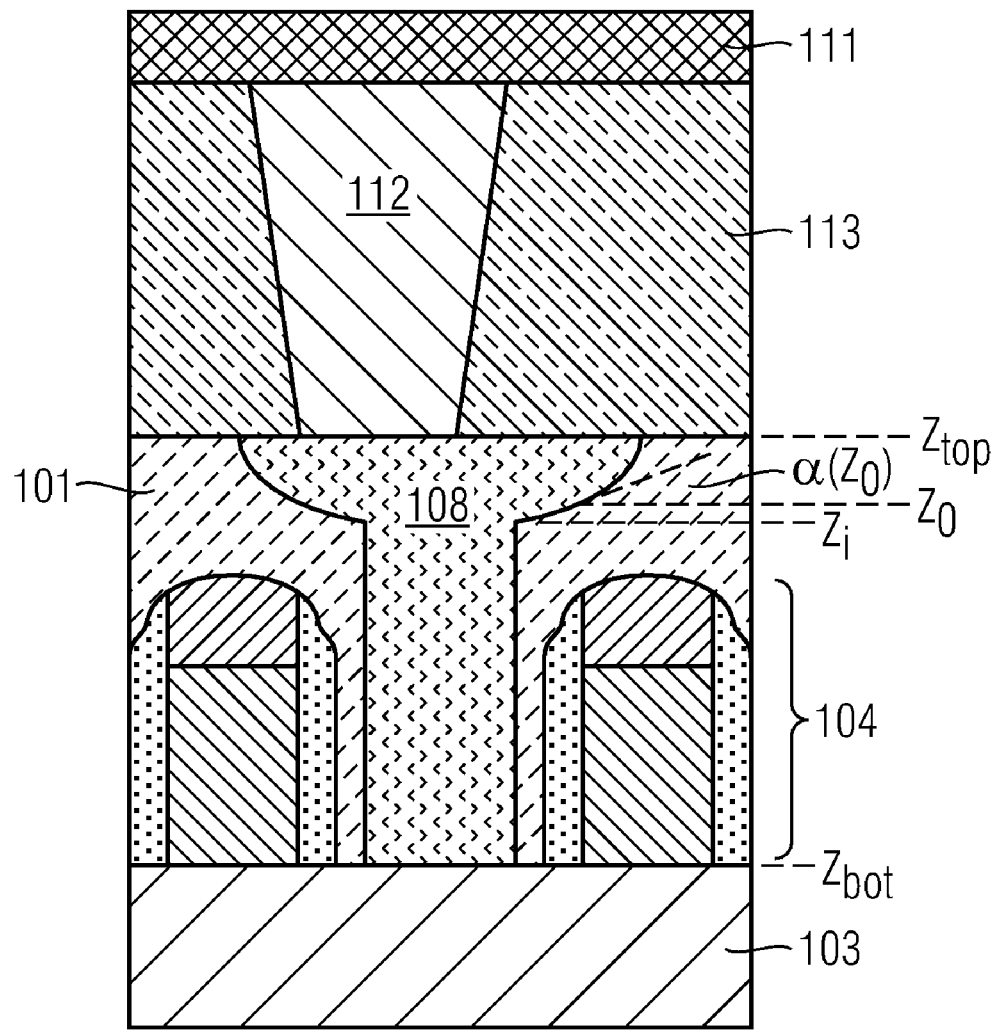
FIG. 7 illustrates a schematic cross-sectional view of a part of an integrated circuit according to one embodiment.

Referring to FIG. 7, part of an integrated circuit is illustrated, which includes the conductive line 108 according to one embodiment. In one embodiment, the integrated circuit may include a memory device, such as a non-volatile or volatile memory device, for example, a ROM or Flash memory or DRAM device. However, the integrated circuit may also include any further devices, such as power devices, high frequency devices, communication devices, for example. The conductive line 108 may define a source line of a NAND memory cell array, for example. The conductive line 108 may be coupled to a metal layer 111, for example MO via contact plugs 112, such as source line contact plugs, which are formed within a further insulating layer 113 on top of the insulating layer 101.

FIG. 8 illustrates a flowchart illustrating a method according to a further embodiment of the invention. Examples given for materials, dimensions or processes in FIG. 1 may also be assigned to the method features illustrated in FIG. 8. After formation of an insulating layer over a surface of a carrier, the insulating layer is anisotropically etched to provide a trench therein (S21). The trench is formed up to a height level above the surface of the carrier so that the trench does not yet form a through-hole in the insulating layer. Then, the etch mask structure provided on the insulating layer is isotropically etched (S22). As an example, a trim process via an $O_2$-flash may be used to isotropically thin the etch mask structure made of, for example, a resist. When isotropically thinning the etch mask structure, its openings are also laterally enlarged. Then, the insulating layer is anisotropically etched, thereby extending the trench by recessing it to uncover one or a plurality of active areas in a lower trench portion and broadening it in an upper trench portion (S23). Thereafter, the trench is filled with a conductive material to provide the conductive line (S24).

Referring to FIGS. 9A to 13B, top views and cross-sectional views of a carrier when performing a method according to a further embodiment are illustrated.

FIG. 9A is a top view of a carrier including an insulating layer 201 formed thereon when performing a method according to a further embodiment. On top of the insulating layer 201, an etch mask structure 202 is formed, the etch mask structure 202 including a line opening that uncovers a part of the insulating layer 201 to be etched in order to define the conductive line. The cut line A-A' denotes the position of the cross-sectional views presented herein below.

Referring to FIG. 9B, a schematic cross-sectional view along the cut line A-A' of FIG. 9A is illustrated. It is to be noted that FIGS. 9A-13B merely illustrate a part of a carrier to be processed, so that the method features are also simultaneously applied to other parts of the carrier, which are not illustrated herein. The carrier 203 is already pre-processed including a gate structure 204 thereon. The gate stack 204 may be formed as the stack 104 of FIG. 2B, for example. The insulating layer 201 is formed over the pre-processed carrier 203. The etch mask structure 202 is formed on top of the insulating layer 201 and includes the etch mask opening 207 to uncover those parts of the insulating layer 201 which have to be etched in order to form the conductive line. In one embodiment, the opening 207 may be formed as a straight line. However, the opening may also be formed as an undulated line or as an opening including consecutive linear parts. A width of the opening 207 is denoted by $W_1$.

Referring to FIG. 10A, anisotropic etching is applied to the insulating layer 201 to provide a trench 214 therein (trench 214 is not visible in FIG. 10A, see FIG. 10B). In the schematic cross-sectional view of FIG. 10B, which is taken along the cut line A-A' of FIG. 10A, the trench 214 includes vertical or nearly vertical sidewalls and extends down to a height level $z_b$ above a surface 215 of the carrier 203. Thus, the trench 214 does not form a through-hole in the insulating layer 201.

Figures 11A, 11B:
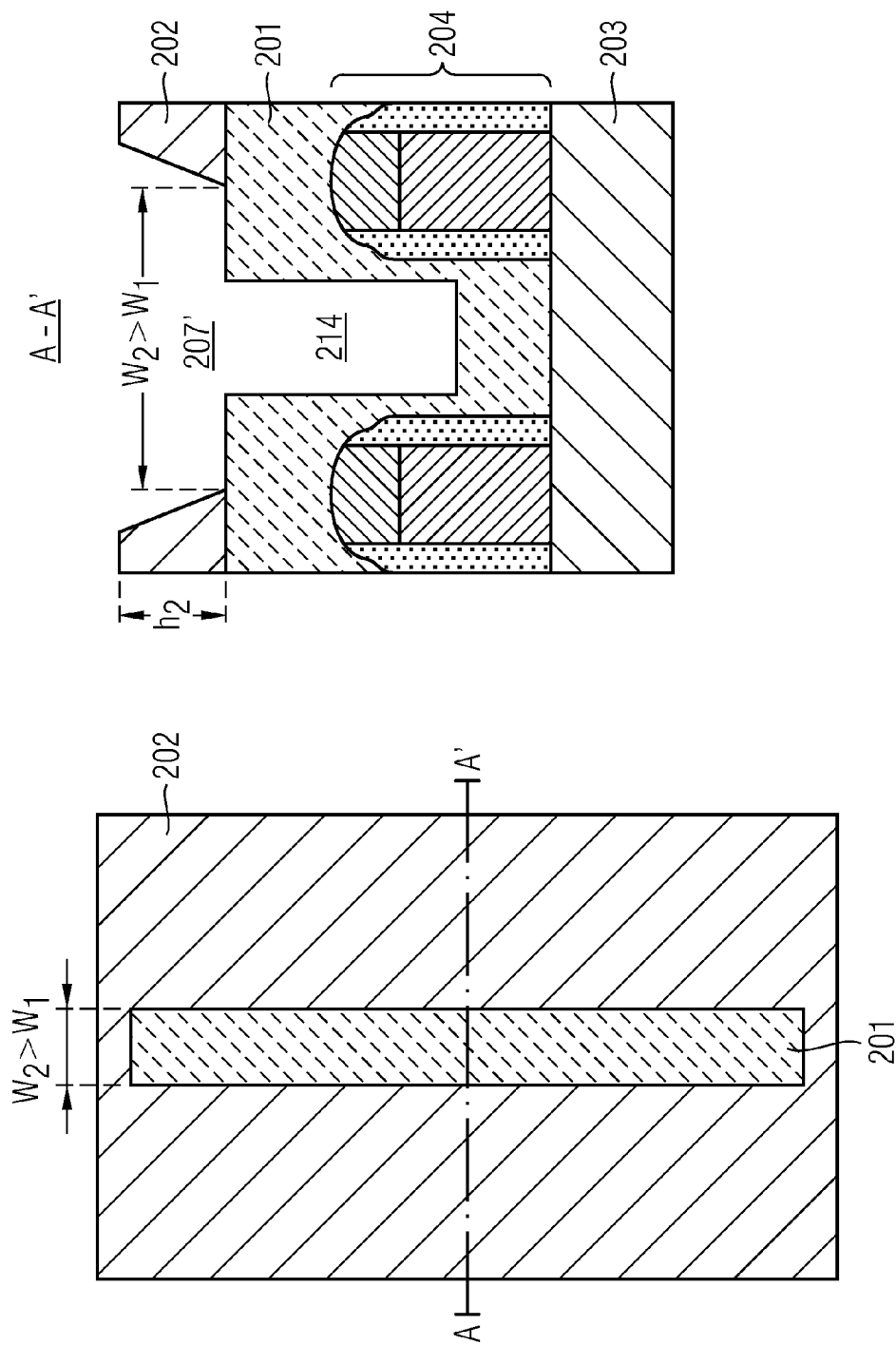

Referring to the schematic top view of FIG. 11A, the etch mask structure 202 is isotropically thinned leading to a lateral enlargement of its openings. The lateral enlargement is denoted by a width $W_2$ being larger than the width $W_1$ of the process stage illustrated in FIG. 10B.

Referring to the schematic cross-sectional view of FIG. 11B, which is taken along the cut line A-A' of FIG. 11A, the enlarged opening 207' including a width $W_2 > W_1$ is illustrated, whereas the vertical thinning is denoted by a height $h_2$ being smaller than the height $h_1$ of the process stage illustrated in FIG. 10B.

Referring to FIG. 12A, an anisotropic etch is applied to the insulating layer 201 expanding the trench to a through-hole so that a corresponding part of the carrier 203 is uncovered. As can be gathered from the cross-sectional view of FIG. 12B, which is taken along the cut line A-A' of FIG. 12A, the anisotropic etching of the insulating layer has multiple effects. As the etch mask structure 202 was previously enlarged, the trench gets broadened in an upper region resulting in the upper trench portion 209. A further effect of the anisotropic etching is the extension of the trench in the vertical direction down to the carrier 203 resulting in the lower trench portion 210. The upper trench portion 209 and the lower trench portion 210 together form a through-hole in the insulating layer 201. Thus, effects of the anisotropic etching can be summarized by a lateral extension of the trench in an upper trench portion and a vertical extension of the trench down to the carrier 203. Hence, the lower trench portion 210 and the upper trench portion 209 are etched in such a manner that a ratio of widths of the upper trench portion and the lower trench portion is independent from the thickness of the insulating layer 201. Contrary thereto, a ratio of widths of the upper trench portion 209 and the lower trench portion 210 would depend upon the thickness of the insulating layer 201 in case a single etch process would be used to define the overall trench 209, 210.

At the interface $z_i$ between the upper trench portion 209 and the lower trench portion 210, the slope $\alpha$ of the sidewall profile in a direction perpendicular to a surface of the carrier 203 reveals a discontinuity. In this regard, reference is taken to FIG. 6 and the respective description part.

Referring to the schematic top view of FIG. 13A, the etch mask structure 202 is removed to uncover the insulating layer 201. The lower trench portion 210 and the upper trench portion 209 are filled with a conductive material to form the conductive line 208.

In FIG. 13B, the conductive line 208 is illustrated in a schematic cross-sectional view taken along the cut line A-A' of FIG. 13A. For example, a further processing of the structure illustrated in FIG. 13B may lead to the integrated circuit of FIG. 7.

Figure 14:
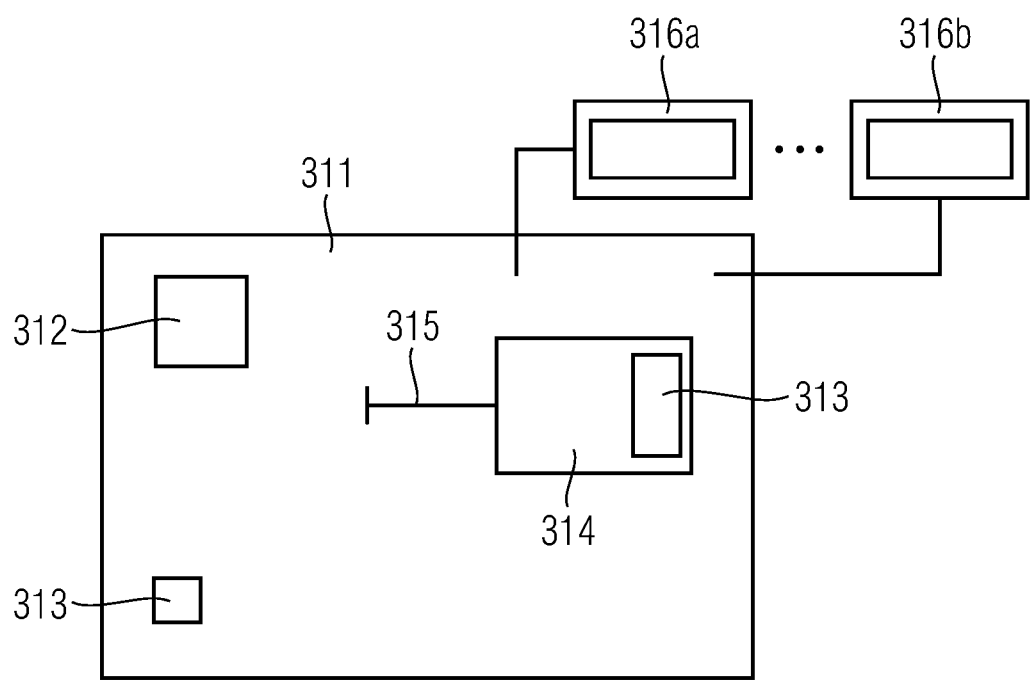
FIG. 14 illustrates a schematic view of one embodiment of an electronic device.

FIG. 14 schematically illustrates an electronic device 311 according to one embodiment. As is illustrated in FIG. 14, the electronic device 311 may include an interface 315 and a component 314 which is configured to be interfaced by the interface 315. The electronic device 311, for example, or the component 314 may include an integrated circuit 313 as has been explained above. The component 314 may be connected in an arbitrary manner with the interface 315. For example, the component 314 may be externally placed so as to be connected with the interface 315. Moreover, the component 314 may be housed inside the electronic device 311 and may be connected with the interface 315. In one embodiment, it is also possible that the component 314 is removably placed into a slot which is connected with the interface 315. When the component 314 is inserted into the slot, the integrated circuit 313 is interfaced by the interface 315. The electronic device 311 may further include a processing device 312 for processing data. In addition, the electronic device 311 may further include one or more display devices 316a, 316b for displaying data. The electronic device may further include components which are configured to implement a specific electronic system. Examples of the electronic system include a computer, for example, a personal computer, or a notebook, a server, a router, a game console, for example, a video game console, as a further example, a portable video game console, a graphic card, a personal digital assistant, a digital camera, a cell-phone, an audio system, such as any kind of music player or a video system. For example, the electronic device 311 may be a portable electronic device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a carrier having a surface;
   an insulating layer over the carrier;
   a memory cell array; and a conductive line comprising a lower line portion and an upper line portion, the lower line portion and the upper line portion directly contacting the insulating layer, wherein the lower line portion includes a side wall profile that is different from the side wall profile of the upper line portion, wherein a bottom side of the lower line portion is in contact with a surface of the carrier, wherein the conductive line is a source line, to which NAND strings of memory cell transistors are connected via select transistors, wherein the upper line portion is partly formed directly above a gate portion of the select transistors, and wherein the insulating layer directly contacts the surface of the carrier between the lower line portion and the gate portion of the select transistors.

2. The integrated circuit of claim 1, wherein a top side of the lower line portion corresponds to a bottom side of the upper line portion.

3. The integrated circuit of claim 1, wherein the lower line portion comprises sidewalls perpendicular to the adjoining surface of the carrier.

4. The integrated circuit of claim 1, wherein the upper line portion comprises curved side walls.

5. The integrated circuit of claim 1, wherein an area of a top side of the upper line portion is larger than an area of the bottom side of the lower line portion.

6. The integrated circuit of claim 1, wherein a plurality of vias are in contact with a top side of the upper line portion.

7. An integrated circuit comprising:
a carrier having a surface;
an insulating layer over the carrier;
a memory cell array; and
a conductive line comprising a lower line portion and an upper line portion, to which a plurality of memory cell transistors are connected, the lower line portion and the upper line portion directly contacting the insulating layer, wherein a slope along a side wall profile of the conductive line in a direction perpendicular to the surface includes a discontinuity between the lower line portion and the upper line portion, wherein a bottom side of the conductive line is in contact with a surface of the carrier, wherein the upper line portion is partly formed directly above a gate portion of the memory cell transistors, and wherein the insulating layer directly contacts the surface of the carrier between the lower line portion and the gate portion of the memory cell transistors.

8. The integrated circuit of claim 7, wherein the lower portion of the conductive line comprises sidewalls perpendicular to the adjoining surface of the carrier.

9. The integrated circuit of claim 7, wherein the upper portion of the conductive line comprises curved side walls.

10. The integrated circuit of claim 7, wherein an area of a top side of the conductive line is larger than an area of the bottom side of the conductive line.

11. The integrated circuit of claim 7, wherein the conductive line is a source line, to which one end of a NAND string array of memory cell transistors is connected via select transistors.

12. A non-volatile semiconductor memory device comprising:
a carrier having a surface;
an insulating layer over the carrier;
a memory cell array comprising NAND strings, wherein each NAND string comprises multiple non-volatile memory transistors connected in series;
a source line, to which one end of the NAND strings is connected via select transistors, the source line further comprising a lower source line portion and an upper source line portion, the lower source line portion and the upper source line portion directly contacting the insulating layer, wherein the lower source line portion includes a side wall profile that is different from the side wall profile of the upper source line portion, and wherein a bottom side of the lower source line portion is in contact with the surface of the carrier, wherein the upper source line portion is partly formed directly above a gate portion of the select transistors, and wherein the insulating layer directly contacts the surface of the carrier between the lower source line portion and the gate portion of the select transistors.

13. The non-volatile semiconductor memory device of claim 12, wherein a top side of the lower source line portion corresponds to a bottom side of the upper source line portion; and wherein the lower source line portion comprises sidewalls perpendicular to the adjoining surface of the carrier.

14. A memory device comprising:
a carrier having a surface;
an insulating layer over the carrier;
storage means for storing an electric charge; and
a conductive line connected to a plurality of the storage means, further comprising a lower line portion and an upper line portion, the lower line portion and the upper line portion directly contacting the insulating layer, wherein the lower line portion includes a side wall profile that is different from the side wall profile of the upper line portion, wherein a bottom side of the lower line portion is in contact with the surface of the carrier, wherein the upper line portion is partly formed directly above a gate portion of the storage means, and wherein the insulating layer directly contacts the surface of the carrier between the lower line portion and the gate portion of the storage means.

15. A non-volatile semiconductor memory device comprising:
a carrier having a surface;
an insulating layer over the carrier;
a memory cell array comprising NAND strings, wherein each NAND string comprises multiple non-volatile memory transistors connected in series; and
a source line comprising a lower source line portion and an upper source line portion, to which one end of the NAND strings is connected via select transistors, the lower source line portion and the upper source line portion directly contacting the insulating layer, wherein a slope of a side wall profile of the source line in a direction perpendicular to the surface includes a discontinuity between the lower source line portion and the upper source line portion, wherein a bottom side of the source line is in contact with the surface of the carrier, wherein the upper source line portion is partly formed directly above a gate portion of the select transistors, and wherein the insulating layer directly contacts the surface of the carrier between the lower source line portion and the gate portion of the select transistors.

16. The non-volatile semiconductor memory device of claim 15, wherein an area of a top side of the source line is larger than an area of the bottom side of the source line.

17. A memory card comprising the non-volatile semiconductor memory device of claim 15.

18. An electronic system comprising:
an electric card interface;
a card slot connected to the electric card interface; and
the memory card as defined in claim 17 configured to be connected and removed from the card slot.

19. A method of forming a conductive line comprising:
forming an insulating layer over a surface of a carrier;
isotropically etching the insulating layer to provide an upper trench portion;
anisotropically etching the insulating layer to provide a lower trench portion, thereby uncovering a plurality of active areas at the surface of the carrier and a plurality of source regions of select transistors of a NAND flash memory device; and
filling the lower and the upper trench portions with a conductive material to provide the conductive line comprising an upper line portion and a lower line portion,
wherein the upper line portion is partly formed directly above a gate portion of the select transistors, and
wherein the insulating layer directly contacts the surface of the carrier between the lower line portion and the gate portion of the select transistors.

20. The method of claim 19, wherein isotropically etching the insulating layer effects an undercut of an etch mask structure provided on a surface of the insulating layer, thereby broadening the upper line portion.

21. The method of claim 19, wherein the conductive material comprises a material selected from the group of W, TiN, WN, TaN, Cu, Ta or any combination thereof.

22. A method of forming a conductive line comprising:
forming an insulating layer over a surface of a carrier;
anisotropically etching the insulating layer to provide a trench therein;
isotropically etching an etch mask structure provided on the insulating layer to enlarge openings of the etch mask structure;
anisotropically etching the insulating layer, thereby recessing the trench to expose a plurality of active areas in a lower trench portion and broadening the trench in an upper trench portion; and
filling the lower and the upper trench portions with a conductive material to provide the conductive line comprising an upper line portion and a lower line portion.

23. The method of claim 22, comprising forming the etch mask structure by a photo resist and isotropic etching thereof if effected by an $O_2$ flash.

24. The method of claim 22, comprising effecting isotropically etching the mask structure by chemical downstream etching.

25. The method of claim 22, wherein the conductive material comprises a material selected from the group of W, TiN, WN, TaN, Cu, Ta or any combination thereof.

26. A method of forming a conductive line comprising:
forming an insulating layer over a surface of a carrier;
etching a lower trench portion and an upper trench portion in such a manner that a ratio of widths of the upper trench portion and the lower trench portion is independent from the thickness of the insulating layer, and uncovering, by etching the lower trench portion, a plurality of source regions of select transistors of a NAND flash memory device; and
filling the lower and the upper trench portions with a conductive material,
wherein the upper trench portion is partly formed directly above a gate portion of the select transistors, and
wherein the insulating layer directly contacts the surface of the carrier between the lower trench portion and the gate portion of the select transistors.

27. The integrated circuit of claim 1, wherein the lower line portion comprises tapered sidewalls.

28. The integrated circuit of claim 7, wherein the lower line portion comprises tapered sidewalls.

29. The method of claim 19, wherein the lower line portion comprises tapered sidewalls.

30. The method of claim 26, wherein the lower trench portion comprises tapered sidewalls.

* * * * *